United States Patent
Arai et al.

[11] Patent Number: 5,848,380
[45] Date of Patent: Dec. 8, 1998

[54] METHOD AND SYSTEM FOR ESTIMATION OF CELL DISCHARGE STOP VOLTAGE

[75] Inventors: Youichi Arai; Tsutomu Saigo, both of Susono, Japan

[73] Assignee: Yazaki Corporation, Tokyo, Japan

[21] Appl. No.: 790,432

[22] Filed: Jan. 29, 1997

[30] Foreign Application Priority Data

Feb. 7, 1996 [JP] Japan .................................. 8-021420

[51] Int. Cl.[6] .................................................. G01R 19/00
[52] U.S. Cl. ........................................................... 702/64
[58] Field of Search ........................... 364/483; 324/431;
320/48, 127; 315/326; 702/63, 64

[56] References Cited

U.S. PATENT DOCUMENTS 5,404,106  4/1995  Matsuda ................................. 324/431
5,479,085  12/1995  Honda et al. ............................ 320/48

*Primary Examiner*—James P. Trammell
*Assistant Examiner*—Matthew Smithers
*Attorney, Agent, or Firm*—Oblon, Spivak, McClelland, Maier & Neustadt, P.C.

[57] ABSTRACT

As a simulation load is driven with an object cell, a cell discharge stop voltage is estimated by collecting data of a discharge current and a terminal voltage, processing the collected data to obtain an approximate linear function between the discharge current and the terminal voltage, substituting a first reference value into the linear function to estimate a first voltage, making a decision for the first voltage having reached a second reference value, responding to the decision for substituting a third reference value into the linear function to estimate a second voltage, and outputting the second voltage as a representative value of the discharge stop voltage.

14 Claims, 6 Drawing Sheets

METHOD AND SYSTEM FOR ESTIMATION OF CELL DISCHARGE STOP VOLTAGE

BACKGROUND OF THE INVENTION

1. Field of the Invention

The present invention generally relates to a method and a system for an estimation or determination (hereafter collectively "estimation") of a cell discharge stop voltage as a voltage for an electric cell to stop a discharge, and particularly, to an estimation method and an estimation system for automatically estimating a discharge stop voltage of an electric cell connected to an electric load.

2. Description of Relevant Art

The cell, in particular a secondary cell such as a storage battery, has its terminal voltage suddenly reduced, when having reached a discharge end voltage. The discharge end voltage is a terminal voltage a cell has thereacross at an end of a discharge time defined for the cell to release a constant discharge current. A typical cell available in the market has a plurality of discharge end voltages labelled or specified as individual ratings for various nominal discharge times. FIG. 7 is a graph showing a number of V (terminal voltage) versus t (charge time) characteristic curves of a battery employable in a later-described embodiment of the present invention. In FIG. 7, a battery capacity C is released at a discharge rate or current (hereafter collectively "amperage") of 1.0 C/h, 0.65 C/h or 0.2 C/h for a nominal discharge time of 1 h, 2 h or 5 h, respectively.

As shown in FIG. 7, assuming C=150 Ah, for example, the battery is allowed for a constant discharge at an amperage of 30 A (=0.2C) over a discharge time of 5 h until it has a discharge end voltage of 10.2 V.

However, such a labelled or specified discharge "end" voltage is a mere rating of a cell that usually has a practical application, where it is connected to a load having a required minimum working voltage in dependence on a state of a whole system including the load. It therefore is necessary for a cell put in practical service to have a discharge "stop" voltage defined for a system status requiring a discharge current from the cell.

In an exemplary system in which the battery of FIG. 7 is connected to a load, a discharge stop voltage of the battery should be determined for a concerned system status requiring an amperage of e.g. 0.2C (=30 A).

It however is difficult to actually measure such a discharge stop voltage. For example, assuming an electric vehicle as the system, letting the concerned system status be a travel at a constant speed, there should be determined a discharge stop voltage from collected measurement data on a terminal voltage of the battery, subject to a constant discharge current of e.g. 0.2C (=30 A). In actual travel, however, the battery of electric vehicle always has a violent variation in discharge current and a corresponding fluctuation in terminal voltage.

Therefore, conventionally, there have been employed practical measures in which a system has its action interrupted simply when a terminal voltage of a battery in the system has turned down to a required minimum working voltage of the system. If the minimum working voltage is e.g. a 9.9 V (<10.2 V), the system action is caused to stop when the battery terminal voltage has come down to the 9.9 V.

In the case of an electric vehicle, a required minimum working voltage has been determined as a statistical value based such as on numbers of travel tests, to be set as a discharge stop voltage for the system.

In an electric vehicle, however, a terminal voltage of a battery installed therein as well as a discharge current always violently fluctuates during a travel, as described.

Therefore, even with a conventional discharge stop voltage preset for a system, it is still uneasy to perform a decision if a battery terminal voltage observed in a travel has reached the preset voltage.

Moreover, the conventional discharge stop voltage is set for an actual system, as a statistical value based such as on numbers of actual travel tests of the system, which should be all repeated each time when even a description of a battery is modified. Such the discharge stop voltage tends to be frequently revised, needing a repetition of an uneasy procedure.

SUMMARY OF THE INVENTION

The present invention has been achieved with such points in mind. It therefore is an object of the present invention to provide an estimation method and an estimation system for estimating a discharge stop voltage of a cell in a facilitated manner without needing a determination based on numbers of tests of an actual system including the cell and a load connected thereto.

To achieve the object, according to a first aspect of the invention, there is provided an estimation method for estimating a discharge stop voltage (V2) of a first cell (7) in an electric system that includes the first cell (7) and a first load (1) drivable for a defined action of the electric system to be kept with a first amperage (I1) supplied from the first cell to the first load (1) until the first cell (7) has a voltage thereacross turned down to the discharge stop voltage (V2), the electric system having a first reference data (I1) representative of the first amperage (I1), a second reference data (V0) representative of a preset value (V0) in place of the discharge stop voltage (V2) to be estimated, and a third reference data (I2) representative of a second amperage (I2) for the first cell (7) to have the voltage thereacross linearly varying with time, the estimation method comprising the steps of providing a second cell (7) equivalent to the first cell (7), providing a second load (1) drivable for a simulation of the defined action of the electric system, driving the second load (1) for the simulation with a discharge current (I) from the second cell (7) to the second load (1), collecting a set of first sample data (D9) representative of the discharge current (In) in an arbitrary time slot (($t_{n-1}$, $t_n$), ($t_{n-1}$, $t_{n-1+j}$)) and a set of second sample data (D11) representative of a terminal voltage ($V_n$) across the second cell (7) in the arbitrary time slot, processing a combination of the set of first sample data (D9) and the set of second sample data (D11) to obtain a linear function ($F_n$) approximately representing a relationship between the discharge current (I) and the terminal voltage (V), substituting the first reference data (I1) into the linear function ($F_n$) to estimate a first voltage data ($V1_n$), making a decision ($V1_m \leq V0$) for the first voltage data ($V1_m$) representing one of an equivalent voltage to and a lower voltage than the second reference data (V0), responding to the decision ($V1_m \leq V0$) for substituting the third reference data (I2) into the linear function ($F_m$) to estimate a second voltage data (V2), and outputting the second voltage data (V2) as a representative data of the discharge stop voltage (V2).

According to the first aspect, there are provided a second cell (7) and a second load (1), and the load (1) is driven for a simulation with a discharge current (I1) from the cell, while collecting sample data (D9, D11) of the discharge current (I) and a terminal voltage (V) across the cell (7) in a time slot, processing the collected data (D9, D11) to obtain an approximate linear function (F) between the discharge current (I) and the terminal voltage (V), substituting a first reference data (I1) into the linear function (F) to estimate a first voltage data (V1), making a decision (V1≦V0) for the first voltage data (V1) having reached a second reference data (V0), responding to the decision (V1≦V0) for substituting a third reference data (I2) into the linear function (F) to estimate a second voltage data (V2), and outputting the second voltage data (V2) as a representative data of a discharge stop voltage (V2) of the cell (7).

As the third reference data (I2) is representative of an amperage (I2) for a first cell (7) to have a voltage thereacross linearly varying with time, the discharge stop voltage (V2) may be estimated for a variety of simulation conditions with a corresponding linearity (L2).

According to a second aspect of the invention, as it depends from the first aspect, the electric system comprises an electric vehicle, and the first load (7) comprises a main motor (1) of the electric vehicle.

According to a third aspect of the invention, as it depends from the second aspect, the defined action comprises a constant travelling of the electric vehicle.

According to a fourth aspect of the invention, as it depends from the third aspect, the first amperage (I1) and the second amperage (I2=−I1) are identical to each other in absolute value and different from each other in sign.

According to a fifth aspect of the invention, as it depends from any of the third to the fourth aspect, the preset value (V0) in place of the discharge stop voltage comprises a discharge end voltage of the first cell (7) or a minimum working voltage of the first load (1), whichever is higher.

Moreover, to achieve the object according to a sixth aspect of the invention, there is provided an estimation system (S) for estimating a discharge stop voltage (V2) of a first cell (7) in an electric system that includes the first cell (7) and a first load (1) drivable for a defined action of the electric system to be kept with a first amperage (I1) supplied from the first cell (7) to the first load (1) until the first cell (7) has a voltage thereacross turned down to the discharge stop voltage (V2), the electric system having a first reference data (I1) representative of the first amperage (I1), a second reference data (V0) representative of a preset value (V0) in place of the discharge stop voltage (V2) to be estimated, and a third reference data (I2) representative of a second amperage (I2) for the first cell (7) to have the voltage thereacross linearly (L2) varying with time, the estimation system (S) comprising a second cell (7) equivalent to the first cell (7), a second load (1) drivable for a simulation of the defined action of the electric system, means (3, 5, 101, Sc) for driving the second load (1) for the simulation with a discharge current (I) from the second cell (7) to the second load (1), and means (9, 11, Sc) operable for collecting a set of first sample data (D9) representative of the discharge current (D9$_n$) in an arbitrary time slot ((t$_{n-1}$, t$_n$), (t$_{n-1}$, t$_{n-1+j}$)), and a set of second sample data (D11$_n$) representative of a terminal voltage (V) across the second cell (7) in the arbitrary time slot, processing a combination of the set of first sample data (D9) and the set of second sample data (D11) to obtain a linear function (F$_n$) approximately representing a relationship between the discharge current (I) and the terminal voltage (V), substituting the first reference data (I1) into the linear function (F$_n$) to estimate a first voltage data (V1$_n$), making a decision (V1$_m$≦V0) for the first voltage data (V1$_m$) representing one of an equivalent voltage to and a lower voltage than the second reference data (V0), responding to the decision (V1$_m$≦V0) for substituting the third reference data (I2) into the linear function (F$_m$) to estimate a second voltage data (V2), and outputting the second voltage data (V2) as a representative data of the discharge stop voltage (V2).

According to the sixth aspect, in an estimation system (S) including a second cell (7) and a second load (1), some means (3, 5, 101, Sc) drive the load (1) for a simulation with a discharge current (I) from the cell (7), and some means (9, 11, Sc) collect sample data (D9, D11) of the discharge current (I) and a terminal voltage (V) across the cell (7), process the collected data (D9, D11) to obtain an approximate linear function (F) between the discharge current (I) and the terminal voltage (V), substitute a reference data (I1) into the linear function (F) to estimate a first voltage data (V1), make a decision (V1≦V0) for the first voltage data (V1) having reached another reference data (V0), respond to the decision (V1≦V0) for substituting another reference data (I2) into the linear function (F) to estimate a second voltage data (V2), and output the second voltage data (V2) as a representative data of a discharge stop voltage (V2) of the cell (7).

As this reference data (I2) represents an amperage (I2) for a first cell (7) to have a voltage thereacross linearly varying with time, the discharge stop voltage (V2) may be estimated for a variety of simulation conditions with a corresponding linearity (L2).

According to a seventh aspect of the invention, as it depends from the sixth aspect, the electric system comprises an electric vehicle, and the first load (1) comprises a main motor (1) of the electric vehicle.

According to an eights aspect of the invention, as it depends from the seventh aspect, the defined action comprises a constant travelling of the electric vehicle.

According to a ninth aspect of the invention, as it depends from the eighth aspect, the first amperage (I1) and the second amperage (I2=−I1) are identical to each other in absolute value and different from each other in sign.

According to a tenth aspect of the invention, as it depends from any of the sixth to the ninth aspect, the preset value (V0) in place of the discharge stop voltage comprises a discharge end voltage of the first cell or a minimum working voltage of the first load, whichever is higher.

Further, to achieve the object according to an eleventh aspect of the invention, there is provided an estimation method for estimating a discharge stop voltage (V2) of a cell (1), the estimation method comprising the steps of responding to a load (7), as it (7) is driven, for collecting a predetermined number of amperage data (D9) of an amperage (I) conducted from the cell (7) to the load (1) and a predetermined number of voltage data (D11) of a voltage (V) across the cell (7), responding to a set of the predetermined number of amperage data (D9) and the predetermined number of voltage data (D11), each time when they (D9, D11) are collected, for determining an approximate linear function (F) of the set of collected data (D9, D11), as it (F) is defined by coordinates of an amperage axis and a voltage axis, responding to the approximate linear function (F), each time when it (F) is determined, for substituting a first reference data (I1) of a positive value to a coordinate of the amperage axis for the approximate linear function (F) to determine a first voltage (V1) on the voltage axis, making a decision (V1≦V0) as to whether or not the first voltage (VI) has reached a second reference data (V0) representing a preset value (V0) in place of the discharge stop voltage (V2) to be estimated, responding to the first voltage (V1), as it (V1) has reached the second reference data (V0), for substituting a third reference data (I2) of a negative value to a coordinate of the amperage axis for the approximate linear function (F) to determine a second voltage (V2) on the voltage axis, and having the second voltage (V2) informed as an estimated value of the discharge stop voltage (V2) of the cell (7) in a system including the cell (7) and the load (1) connected thereto.

According to the eleventh aspect, as a load (1) is driven, there are collected combinations of data (D9) on an amperage (I) conducted from a cell (7) to the load (1) and data (D11) on a terminal voltage (V) across the cell (7). Each time when such data combinations (D9, D11) amount to a predetermined number, the collected data are processed to determine an approximate linear function (F) approximating a relationship (I=aV+b) between their coordinates on amperage and voltage axes. Then, a first reference data (I1) of a positive value is substituted to a coordinate (I) of the amperage axis to determine a first voltage (VI) on the voltage axis, which voltage (V1) is compared with a second reference data (V0) that is preset in place of the discharge stop voltage, for a decision (V1≦V0) as to whether or not the first voltage (V1) has come down to the preset value (V0).

If the first voltage (V1) has reached the preset discharge stop voltage (V0), a third reference data (I2) of a negative value is substituted to a coordinate (I) of the amperage axis to determine a second voltage (V2) on the voltage axis, which voltage (V2) is informed as a discharge stop voltage estimated for the cell (7), as it is connected to the load (1) in an electric system such as an electric vehicle.

Therefore, the estimated discharge stop voltage (V2) is found on a straight V-t characteristic line (L2) that may be employed in the electric system, for a prediction or decision such as of a time point (te) for a battery section to stop a discharge.

Furthermore, to achieve the object according to a twelfth aspect of the invention, there is provided an estimation system (S) for estimating a discharge stop voltage (V2) of an object cell (7) to be measured and installed in an electric system including a load (1) connectable thereto, the estimation system (S) comprising a simulation load (1) corresponding to the load (1) of the electric system, the object cell (7) connected to the simulation load (1), detection means (9, 11) for detecting a discharge current (I) conducted from the object cell (7) to the simulation load (1) and a terminal voltage (V) of the object cell (7), voltage vs. amperage variation tendency calculating means (25) for collecting a predetermined number of data (D11) of the terminal voltage (V) and a predetermined number of data (D9) of the discharge current (I) from the detection means (9, 11) onto a voltage axis and an amperage axis, respectively, voltage vs. amperage approximate linear function calculating means (27) for determining an approximate linear function (F) defined to the voltage axis and the amperage axis for the predetermined numbers of data (D9, D11) of the terminal voltage (V) and the discharge current (I), as they (D9, D11) are collected thereonto within a period of time (($t_{n-1}$, $t_n$), ($t_{n-1}$, $t_{n-1+j}$)), first discharge stop voltage calculating means (29) responsive to the approximate linear function (F), each time when it (F) is determined, for substituting a first reference data (I1) of a positive value to a coordinate of the amperage axis for the approximate linear function (F) to determine a first voltage (V1) on the voltage axis, and for making a decision (V1≦V0) as to whether or not the first voltage (V1) has reached a second reference data (V0) representing a preset value (V0) in place of the discharge stop voltage (V2) to be estimated, and second discharge stop voltage calculating means (31) responsive to the first voltage (V1), as it (V1) has reached the second reference data (V0), for substituting a third reference data (I2) of a negative value to a coordinate of the amperage axis for the approximate linear function (F) to determine a second voltage (V2) on the voltage axis, and for having the second voltage (V2) displayed as an estimated value of the discharge stop voltage (V2) of the object cell (7), as it (7) is installed in the electric system.

According to the twelfth aspect, as a load (1) is driven, a voltage vs. amperage variation tendency calculating means (25) collects combinations of data (D9) on an amperage (I) conducted from a cell (7) to the load (1) and data (D11) on a terminal voltage (V) across the cell (7). Each time when such data combinations (D9, D11) amount to a predetermined number, a voltage vs. amperage approximate linear function calculating means (27) processes the collected data to determine an approximate linear function (F) approximating a relationship (I=aV+b) between their coordinates on amperage and voltage axes. Then, a first discharge stop voltage calculating means (29) substitutes a first reference data (I1) of a positive value to a coordinate (I) of the amperage axis to determine a first voltage (V1) on the voltage axis, which voltage (V1) is compared with a second reference data (V0) that is preset in place of the discharge stop voltage, for a decision (V1≦V0) as to whether or not the first voltage (V1) has come down to the preset value (V0).

If the first voltage (V1) has reached the preset discharge stop voltage (V0), a second discharge stop voltage calculating means (31) substitutes a third reference data (I2) of a negative value to a coordinate (I) of the amperage axis to determine a second voltage (V2) on the voltage axis, which voltage (V2) is displayed as a discharge stop voltage estimated for the cell (7), as it is connected to the load (1) in an electric system.

It therefore is permitted to estimate a discharge stop voltage (V2) by a simulation, such as in a development stage, without the need of an actual travel.

According to a thirteenth aspect of the invention, as it depends from the twelfth aspect, the first discharge stop voltage calculating means (29) is responsive to the first voltage (V1), as it (V1) has not reached the second reference data (V0), for causing the voltage vs. amperage variation tendency calculating means (25) to again collect data (D9, D11) of the terminal voltage (V) and the discharge current (I).

According to a fourteenth aspect of the invention, as it depends from the twelfth or the thirteenth aspect, the voltage vs. amperage approximate linear function calculating means (27) is responsive to the predetermined numbers of data (D9, D11) of the terminal voltage (V) and the discharge current (I), each time when they (D9, D11) are collected, for applying a method of least squares to determine the approximate linear function (F).

BRIEF DESCRIPTION OF THE ACCOMPANYING DRAWINGS

The above and further objects and novel features of the present invention will more fully appear from the following detailed description when the same is read in conjunction with the accompanying drawings, in which.

DETAILED DESCRIPTION OF THE PREFERRED EMBODIMENTS

Figure 1:
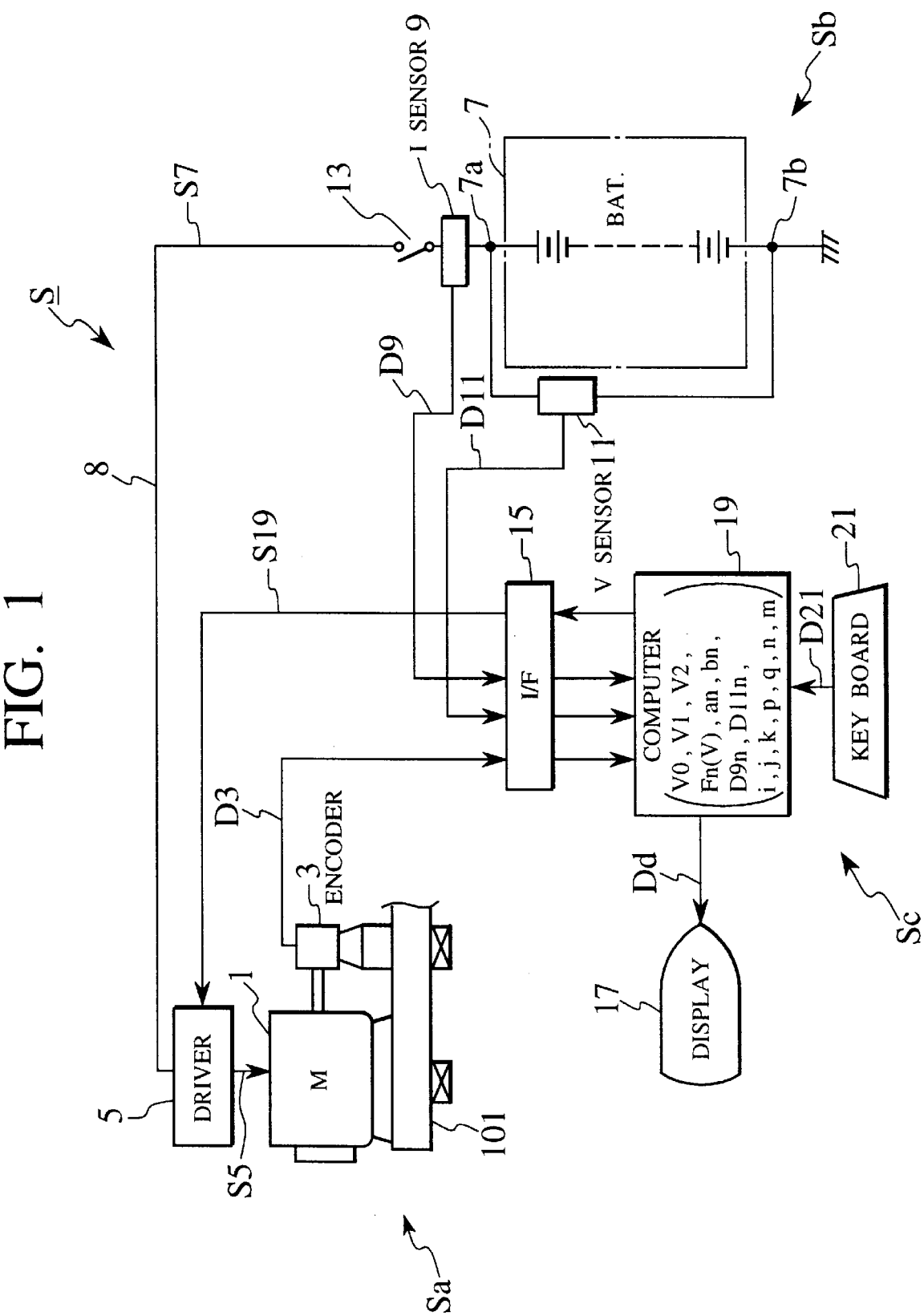
FIG. 1 is a schematic block diagram of a system for estimating a discharge stop voltage of an electric cell according to an embodiment of the invention.

There will be detailed below the preferred embodiments of the present invention with reference to the accompanying drawings. Like members are designated by like reference characters.

FIG. 1 is a schematic block-diagram of a system for estimating a discharge stop voltage of an electric cell according to an embodiment of the invention.

In the embodiment of FIG. 1, the electric cell is composed of a secondary cell system as a storage battery 7 connected to an electric load exemplarily constituted with a main motor 1 to be installed in an electric vehicle, so that a discharge stop voltage is automatically estimated with respect to the battery 7 driving the main motor 1.

In FIG. 1, designated by reference character S is an entirety of the cell discharge stop voltage estimating system. The system S comprises: a load section Sa that performs a simulation on a simulation stand 101; a battery section Sb that supplies electric power S7 to the load section Sa; and a computer section Sc that controls the simulation of the load section Sa by a control signal S19, collects a status data D3 of the simulation from the load section Sa and a combination of an amperage data D9 and a voltage data D11 of the supplied power S7 from the battery section Sb, and processes the data D3, D9, D11 to provide the control signal S19 and to estimate the discharge stop voltage. More specifically, the load section Sa includes the main motor 1 mounted on the simulation stand 101, an encoder 3 for detecting a number of revolutions of the main motor 1 to provide the status data D3, and a driver 5 for driving the main motor 1 with the supplied power S7, as it is controlled to output drive power S5 in dependence on the control signal S19. The battery section Sb includes the battery 7 having a positive pole terminal 7a and a grounded negative pole terminal 7b, a power supply line 8 connected at one end thereof via a power throw-in switch 13 to the positive terminal 7a of the battery 7 and at the other end thereof to an input end of the driver 5 for supplying the electric power S7, an amperage sensor 9 for detecting an amperage I as a discharge current conducted by the power supply line 8 to provide the amperage data D9, and a voltage sensor 11 for detecting a terminal voltage V across the battery 7 as a potential difference between the positive and negative terminals 7a, 7b thereof to provide the voltage data D11. The serially connected power switch 13 is a normal open type operable to close the circuit.

The computer section Sc comprises: a computer 19 composed of a central processing unit, a ROM, a RAM, a combination logic and data buses; and peripheral equipment including a display 17, a key board 21, and an input/output interface unit (hereafter "IF") 15 for interfacing the control signal S19, the simulation status data D3 and the amperage and voltage data D9 and D11 between the computer 19 and the driver 5, encoder 3 and amperage and voltage sensors 9 and 11 so that the data D3, D9, D11 may be analog-to-digital converted. The computer 19 performs a variety of programmed tasks including a principal one having the steps of:

collecting an adequate number of amperage data $D9_n$ (hereafter sometimes collectively "D9") and an identical number of corresponding voltage data $D11_n$ (hereafter sometimes collectively "D11"), as they are sampled in a current time slot that is an n-th one ($t_{n-1}$, $t_n$) of sequential time slots ($t_0$, $t_1$), ($t_1$, $t_2$), . . . , ($t_{n-1}$, $t_n$), . . . between a sequence of time points $t_i$ defined on a temporal axis t at intervals of a predetermined time period equivalent to $t_1-t_0$ (e.g. 100 msec, 10 sec, or 1000 sec) or that is an n-th time slot ($t_{n-1}$, $t_{n-1+j}$) in a sequence of partially overlapping time slots ($t_0$, $t_j$), ($t_1$, $t_{1+j}$), ($t_2$, $t_{2+j}$), . . . , ($t_{n-1}$, $t_{n-1+j}$) of an even time interval (e.g. 1000 sec), . . . , where the suffixes "n", "i" and "j" are arbitrary positive integers;

processing a sequence or set $\{D9_n\}$ of collected and/or trimmed amperage data D9 or subsequences or subsets thereof and a sequence or set $\{D11_n\}$ of collected and/or trimmed voltage data D11 or subsequences or subsets thereof to estimate an approximate linear function $F_n(V)$ (hereafter sometimes "$F_n$" or simply "F") representative of a current V-I characteristic of the battery 7, such that $I=F_n(V)=a_nV+b_n$, where $a_n$ (hereafter sometimes collectively "a") is a negative slant of the current linear function $F_n$ for the n-th time slot, and $b_n$ (hereafter sometimes collectively "b") is a positive I-intercept of the current linear function $F_n$;

substituting a first reference value I1 of the amperage I (e.g. I1=10 [A]) to an amperage term I of the linear function $F_n$ to thereby estimate a current first value $V1_n$ [V] (hereafter sometimes simply "V1") of the voltage V as a current candidate for a discharge stop voltage, such that $V1_n=(I1-b_n)/a_n>0$;

reading a reference discharge stop voltage V0>0, as it is a stored preset value due such as to a factory test;

comparing the first voltage value $V1_n$ with the reference voltage V0;

responding to a decision such that $V1_n>V0$, to increment n so that n=n+1, and to repeat the foregoing steps;

responding to a decision in an m-th time slot such that $V1_m \leq V0$, where m is an integer such that $m \geq n$, to substitute a second reference value I2 of the amperage I (e.g. I2=−I1=−10 [A]) to a current approximate linear function $F_m(V)=a_mV+b_m$ (=I), thereby estimating a second value V2 [V] of the voltage V as a final candidate for a discharge stop voltage, such that $V2=(I2-b_m)/a_m$; and outputting a display data Dd representative of the second voltage value V2 to the display 17, where it is displayed as an estimated discharge stop voltage for a simulated application of the battery 7, while n is reset to 1.

For the load section Sa, the computer 19 serves for processing a combination of the revolution-number-representative status data D3 from the encoder 3 and a motor speed indication data D21 from the key board 21 to output the control signal S19 to the driver 5, which is responsive thereto to control the main motor 1 so that the motor 1 is driven always at a speed indicated by the keyboarded data D21.

The computer 19 functions as described, so that "a first reference value I1 (e.g. 10 A) is substituted in an approximate linear function $F_n$ to obtain a first voltage V1, before a second reference value I2 (e.g. −10 A) is substituted to an approximate linear function $F_m$ to estimate a second voltage V2 as an estimated discharge stop voltage", which will be further described.

In general, a battery 7 connected to a main motor 1 experiences violent variations of a discharge current I as well as of a terminal voltage V, due such as to a chopping of a rotor of the motor 1, as it is rotated.

On the other hand, in an electric vehicle travelling at a constant speed, a battery 7 has its capacity consumed to be reduced at a rate that typically is substantially even, as the time elapses.

For such reasons, there are employed a plurality of amperage detection data and a plurality of voltage detection data for a calculation to obtain an approximate function of a V-I characteristic with a linearity, whereto a certain reference value (positive 10 A) is substituted to estimate a terminal voltage, which in due course turns down to a preset value as a discharge stop voltage, when a system action stops.

Figure 4:
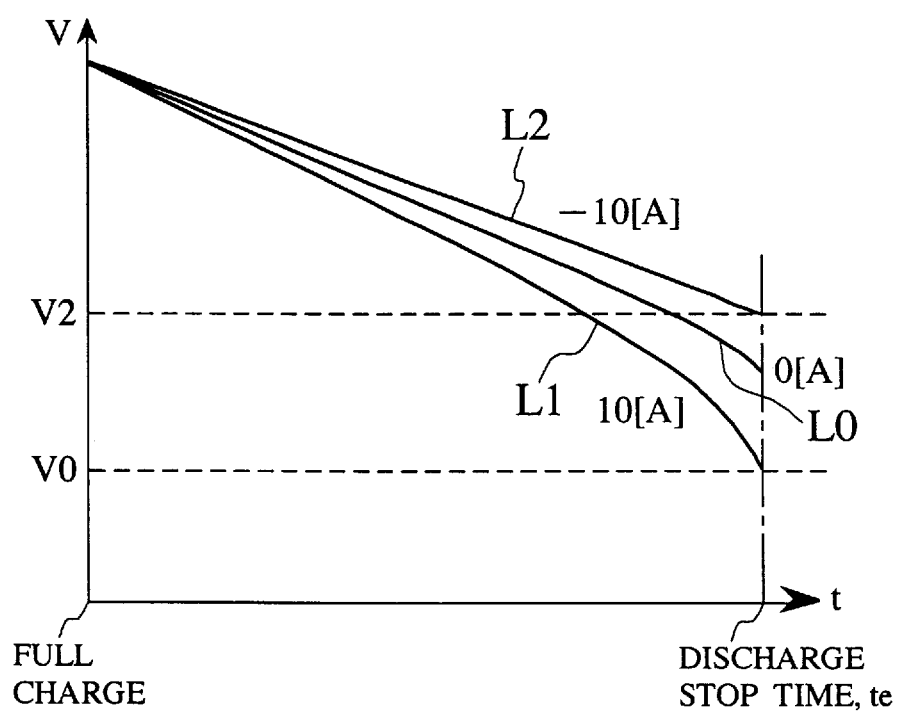
FIG. 4 is a graph describing a principle of an estimation of the discharge stop voltage.
Figure 5:
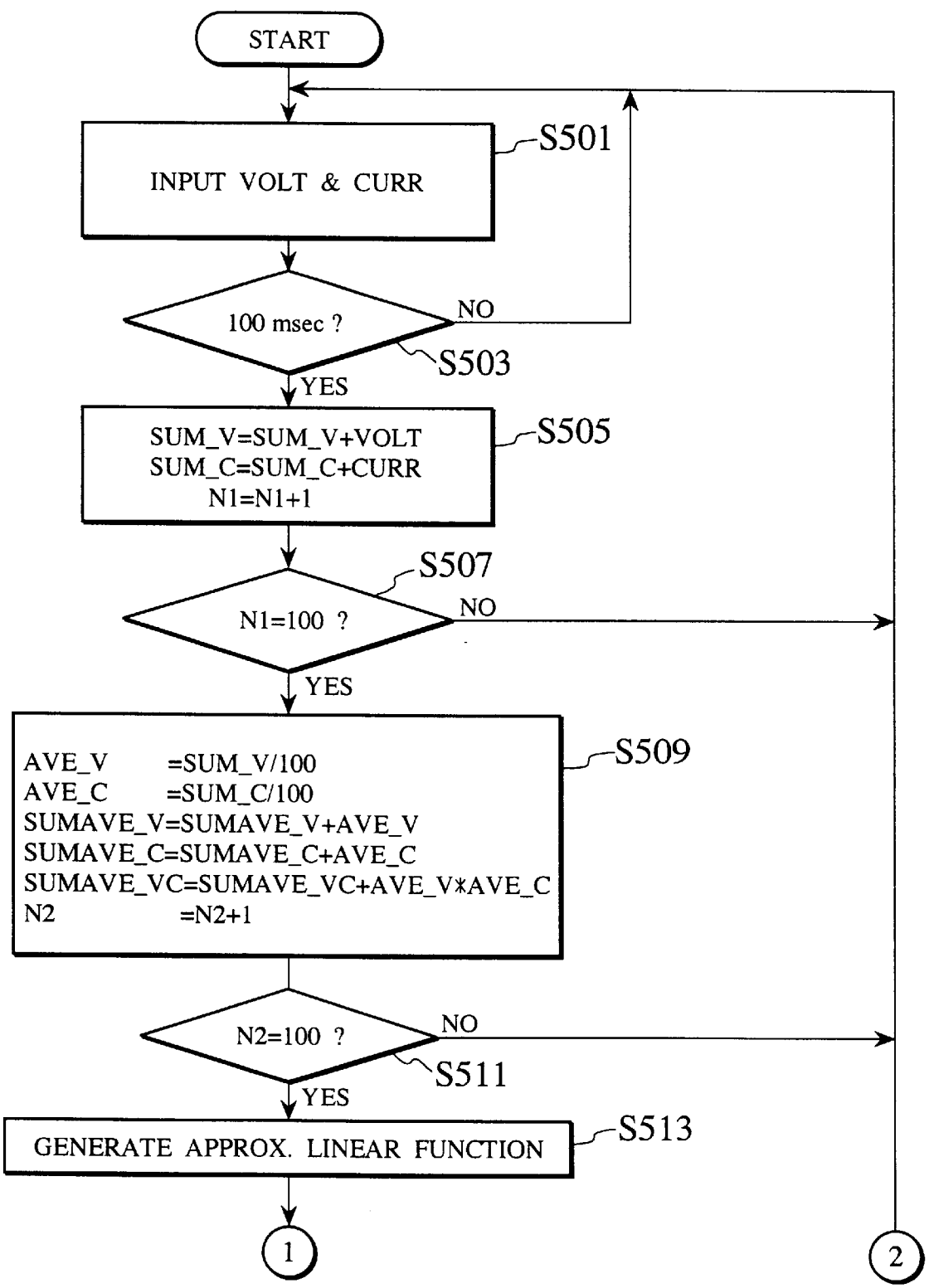
FIGS. 5 and 6 are flow charts of programmed actions of the computer of FIG. 2.

However, those data collected from a temporal region vicinal to an end of a discharge stop time (e.g. 5 hours) give a series of approximate linear functions such that those terminal voltages estimated therefrom represent a characteristic having an increasing tendency to describe a curve (such as a characteristic line L1 of 10 A or L0 of 0 A in FIG. 4), as it approaches close to a discharge stop time point, without showing a desirable linearity (such as of a characteristic line L2 of −10 A in FIG. 4).

To this point, the terminal voltage estimation using an approximate linear function is best effective in a constant travelling in which a battery 7 has its capacity reduced at a substantially even rate, as the time elapses.

In other words, it is desirable for a discharge stop voltage to be estimated from an approximate linear function with an ideal linearity (e.g. line L2 of FIG. 4).

In this respect, the battery has a unique correlation of characteristic between a charge phase in which a charge current inflows and a discharge phase in which a discharge current goes out, as they are reversible.

On such bases, in the embodiment, a first reference amperage I1 is substituted to a current approximate linear function $F_n$ to obtain a first voltage V1 as an estimated terminal voltage V, which voltage V1 is compared with a reference discharge stop voltage V0 due such as to an actual test, and when the former V1 has come down to the latter V0, a second reference amperage I2 (=−I1) is substituted to a current approximate linear function $F_m$ to thereby estimate a second voltage V2 as an estimated discharge stop voltage.

In a system, its minimum working voltage may be lower than a discharge end voltage. In one modification, the reference stop voltage V0 may be a conventional discharge stop voltage which may be determined for a system status that requires a constant discharge current equivalent to the first reference amperage I1.

In another modification, the reference stop voltage V0 may be a discharge end voltage that the battery 7 may have at an end of a nominal discharge time (e.g. 5 h), as the first reference amperage I1 is constantly discharged.

In one analysis, a battery 7 has a terminal voltage V, such that V=Emf−IRi in a discharge phase or V=Er+IRi in a charging phase, where Emf is an electromotive force, Er is a reverse Emf and Ri is an internal resistance of the battery 7. If I=0, then V=Emf or Er. Letting I =I1 (=−I2), it so follows that V1=Emf−I1Ri and V2=Er+I2Ri=Er−I1Ri, and hence V2−V1=Er−Emf. As V1≦V0, the second voltage V2 may be such that V2≦Er−Emf+V0, which should be inherent to the battery subject to V0.

In another analysis, a battery 7 delivers a discharge current I such that I=$a_n$V+$b_n$ for a constant travel during an n-th time slot. The slant $a_n$ is negative, and has a larger absolute value as the time t elapses. For the constant travel, an electric vehicle needs a constant amperage I1, and the battery 7 should have a terminal voltage $V1_n$ such that $V1_n$=(I1−$b_n$)/$a_n$>0 during the n-th time slot. On the other hand, the battery 7 exhibits a "monotone-decreasing" non-linear V-t characteristic L1 for the amperage I1 over a discharge time between t=0 and t=te (FIG. 4). The time point te has not been known yet. But, the battery 7 should be operable at t=te, for developing a discharge end voltage or a required minimum working voltage, whichever is higher. This voltage is thus compared as a reference voltage V0 with the temporal estimated value $V1_n$. At a critical m-th time slot, if $V1_m$ ≦V0, then the discharge should be stopped, interrupting a system action. However, the m-th time slot is critical, and it might be inconvenient for a driver to enter an associated necessary action. Therefore, a corresponding charge current I2(=−I1) is substituted to obtain an apparent voltage V2, such that V2=(I2−$b_m$)/$a_m$>0. Such the voltage V2 should be found on a linear V-t characteristic curve L2, as one may observe in a charging phase, thus permitting a linear prediction to be achieved earlier.

In one interpretation, a now electric vehicle may be a combination of a battery 7 and an electric load (inclusive of a main motor 1) of which power consumption is linear, as the vehicle travels at a constant speed along a mono-tone road. Performance of such the load may well be represented by action of the main motor 1.

In another interpretation, the embodiment has mapped an actual non-linear V-I characteristic of a battery 7 into an apparent or imaginary field, where it appears linear. If no more than this linear characteristic were directly observed from an actual world, it might have been a mere interesting. However, in the embodiment, the actual world is communicating via a conditional simulation with the imaginary field, so that an observer is permitted to live in this field in which associated equipment such as a display 17 performs a mapped display. Such a display may well be performed in an electric vehicle having installed therein a system S except for a simulation stand 101. The point for a passenger is when to start a necessary action before a discharge stop, but for a manufacturer it is how to give convenient and useful information in an inexpensive manner.

Figure 2:
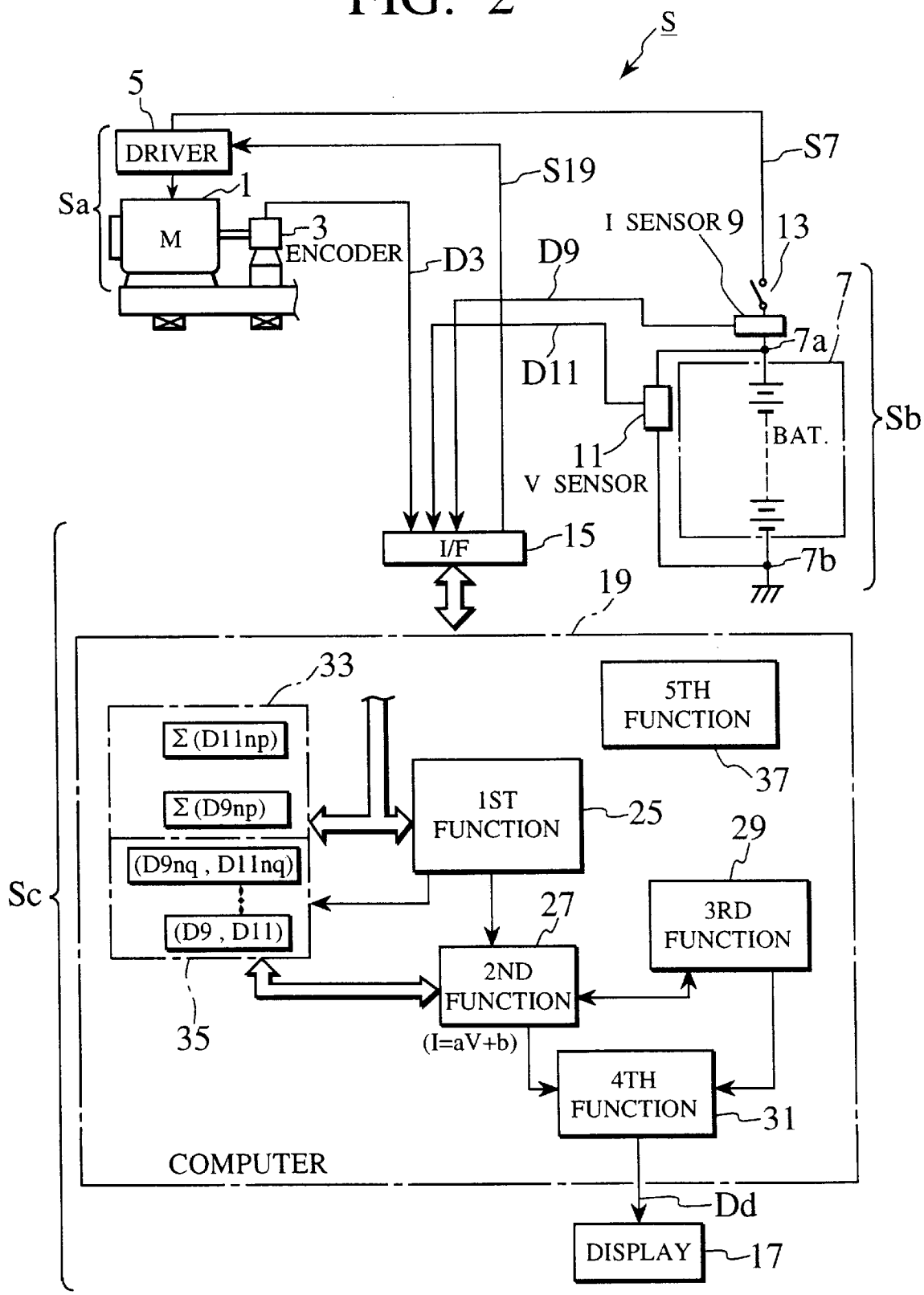
FIG. 2 is a block diagram of the system of FIG. 1, illustrating a functional constitution of a computer in a computer section thereof.

FIG. 2 is a block diagram of the system S of FIG. 1, illustrating a functional constitution of the computer 19 in the computer section Sc, as the functional constitution corresponds to a file constitution of programs stored in the ROM to permit a programmed estimatation of the estimated discharge stop voltage, etc.

As shown in FIG. 2, the computer 19 has a first function 25 as a data trimming function or a voltage (V)-amperage (I) variation tendency calculating function, a second function 27 as an $F_n$ generating function or a voltage (V)-amperage (I) approximate line calculating function, a third function 29 as a V1 estimating and comparing function or a first discharge stop voltage calculating function, a fourth function 31 as a V2 estimating function or a second discharge stop voltage calculating function, and a fifth function 37 as a simulation control function or a load control function.

The first function 25 is programmed for:

sampling the amperage detection data D9 (as a k-th sampled amperage data $D9_{nk}$ in an n-th time slot, where k is an arbitrary integer such that 1≦k≦100) and the voltage detection data D11 (as a k-th sampled voltage data $D11_{nk}$ in the n-th time slot) at intervals of a predetermined time of 100 msec, which data $D9_{nk}$ and $D11_{nk}$ may be stored in the RAM;

adding the k-th sampled amperage data $D9_{nk}$ and the k-th sampled voltage data $D11_{nk}$ to a previous sum $\Sigma^{(p=)k-1}$ of amperage data $D9_{np}$ (p is an arbitrary integer such that $1 \leq p \leq k$) sampled in the n-th time slot and a previous sum $\Sigma^{(p=)k-1}$ of voltage data $D11_{np}$ sampled in the n-th time slot to obtain a current sum $\Sigma^k$ of amperage data $D9_{np}$ and a current sum $\Sigma^k$ of voltage data $D11_{np}$, respectively;

storing the current sums $\Sigma^k(D9_{np})$ and $\Sigma^k(D11_{np})$ in corresponding blocks of a memory 33 of the RAM, where the previous sums $\Sigma^{k-1}$ are updated to the current sums $\Sigma^k$, respectively, and incrementing k so that k=k+1;

repeating the foregoing steps till k becomes 100 as a q-th time (q is an arbitrary integer such that $1 \leq q \leq 100$) in the n-th time slot;

dividing the sums $\Sigma^k(D9_{np})$ and $\Sigma^k(D11_{np})$ by k to obtain a q-th averaged amperage data $D9_{nq}$ in the n-th time slot and a q-th averaged voltage data $D11_{nq}$ in the n-th time slot, respectively, before resetting k to 1;

storing a current combination $(D9_{nq}, D11_{nq})$ of the q-th averaged amperage data $D9_{nq}$ and the q-th averaged voltage data $D11_{nq}$ at a q-th address in another memory 35 of the RAM, where a previous combination $(D9_{(n-1)q}, D11_{(n-1)q})$ of averaged amperage and voltage data $D9_{(n-1)q}$ and $D11_{(n-1)q}$ are updated to the current combination $(D9_{nq}, D11_{nq})$, before incrementing q so that q=q+1; and repeating the foregoing steps till q becomes 100, before resetting q to 1.

Accordingly, there is provided a set $\{(D9_{nq}, D11_{nq})\}$ of trimmed dispersion data $(D9_{nq}, D11_{nq})$ of a discharge current as amperage I and a terminal voltage V of the battery 7 in an arbitrary n-th time slot.

The second function 27 is programmed for:

reading from the memory 35 the set $\{(D9_{nq}, D11_{nq})\}$ of dispersion data $(D9_{nq}, D11_{nq})$ or a subset thereof, i.e. a plurality of averaged amperage data D9 and a plurality of averaged voltage data D11, as dependent and independent variables I and V of a linear function I=aV+b, respectively; and generating a current approximate linear function $F_n$ such that $I = F_n(V) = a_n V + b_n$, by applying a method of least squares to the read data of the linear function, as the method is based on a known principle in which the slant a (to be $a_n$) and the intercept b (to be $b_n$) are estimated so as to minimize a total sum $\Sigma_q$ of respective squares $\{D9_{nq} - (aD11_{nq} + b)\}^2$ of differences $\{D9_{nq} - (aD11_{nq} + b)\}$ between respective given data $D9_{nq}$ of the dependent variable I and corresponding values of the function aV+b, as the independent variable V is each respectively substituted by a corresponding given data $D11_{nq}$.

The third function 29 is for substituting a 10 [A] as a first reference value I1 to the approximate linear function $F_n$ to estimate a current first voltage V1, comparing the first voltage V1 with a reference discharge stop voltage V0 due such as to a test, making a decision as to whether or not $V1 \leq V0$, and responding to a decision such that $V1 \leq V0$ to drive a file of the fourth function 31.

The fourth function 31 serves, when informed of the decision of $V1 \leq V0$, for substituting a −10 [A] as a second reference value I2 to a current approximate linear function $F_m$ to estimate a second voltage V2 as a normal discharge stop voltage, and outputting a display data Dd of the second voltage V2 to the display 17, where it is displayed.

The fifth function 37 is for performing a decision as to whether or not the rotation data D3 from the encoder 3 represents a constant rotation, and for responding to a decision that it is not so, to output via the IF 15 to the driver 5 the control signal S19 for controlling the motor 1 at a constant rotation.

Figure 3:
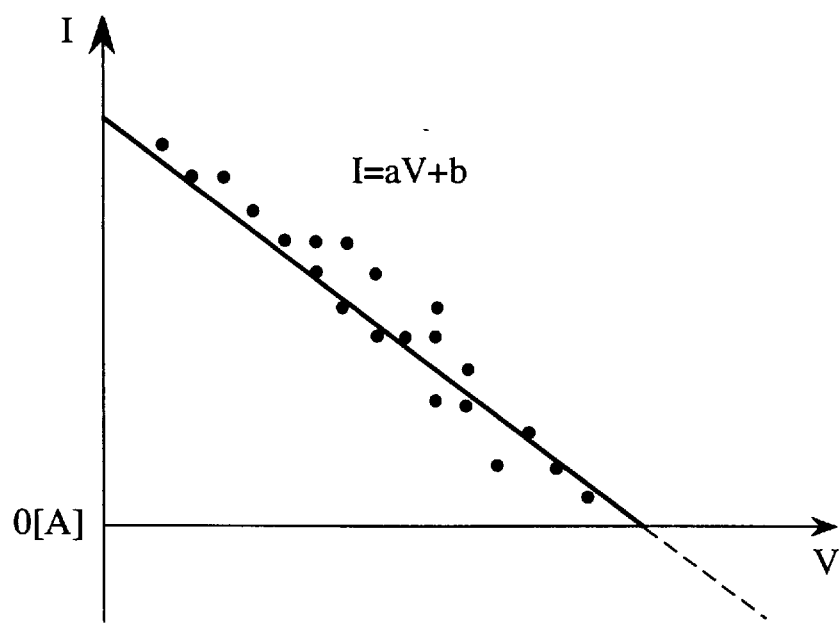
FIG. 3 is a graph describing an approximate linear function representative of a voltage vs. amperage characteristic of the cell of FIG. 1.

There will be described actions of the cell discharge stop voltage estimating system S, with reference to FIGS. 3 to 6. The actions will sometimes be explained in a modified manner from a different point of view in terms of a C language, as a mere illustration within the scope of the invention. FIG. 3 is a graph describing an approximate linear function, FIG. 4 is a graph describing a relationship between a discharge stop voltage and a discharge time, and FIGS. 5 and 6 cooperatively provide a flow chart of a program flow of the system S.

As the power switch 13 is operated for a connection of the line 8 to supply the electric power S7 via the driver 5 to the main motor 1, the computer 19 has a file of the first function 25 driven so that a step S501 inputs sensor data V0LT (voltage detection data D11 from the voltage sensor 11) and CURR (amperage detection data D9 from the amperage sensor 9).

A decision step S503 checks if a time interval of 100 msec has elapsed. If it has elapsed, the program flow goes from the step S503 to a subsequent step S505, where sensor data V0LT and CURR sampled every 100 msec are added to previous values of a sum SUM_V of voltage data and a sum SUM_C of amperage data, such that:

$$SUM\_V = SUM\_V + V0LT \text{ and}$$

$$SUM\_C = SUM\_C + CURR,$$

and resulted sums are stored in the memory 33, incrementing a count number N1 such that N1=N1+1, as it represents a number of summed data respectively of the voltage data V0LT and the amperage data CURR.

Then, a decision step S507 checks if the count number N1 has reached 100. If it is so, the flow goes to a subsequent step S509, where the summed voltage data and the summed amperage data are averaged, as they have amounted to a predetermined number, respectively, and the respective average data are stored separately in the memory 35, incrementing a count number N2 of each sort of averaged voltage and amperage data, so that as a whole:

$$AVE\_V \text{ (averaged voltage per 10 sec)} = SUM\_V/100,$$

$$AVE\_C \text{ (averaged amperage per 10 sec)} = SUM\_C/100,$$

and additionally, $$SUMAVE\_V \text{ (sum of } AVE\_V) = SUMAVE\_V + AVE\_V,$$

$$SUMAVE\_C \text{ (sum of } AVE\_C) = SUMAVE\_C + AVE\_C,$$

$$SUMAVE\_VC \text{ (sum of } AVE\_V \text{ and } AVE\_C) = SUMAVE\_VC + AVE\_V*AVE\_C$$

then N2=N2+1, whereas the SUMAVE_V, SUMAVE_C and SUMAVE VC are taken for use in calculations associated with later-described expressions of a and b.

Then, a decision step S511 checks if the count number N2 of each sort of averaged voltage and amperage data has reached 100. Unless it is so, the flow again goes to the step S501 in order to repeat a summation of a total of 100 voltage data and that of a total of 100 amperage data, to have a total of 100 average data depending on a respective number of summations.

As a result, the file of the first function 25 has obtained as in FIG. 3 a set of dispersed data including a plurality of combinations of voltage and amperage data defined on a voltage axis V and an amperage axis I, respectively, in correspondence to a plurality of discharge characteristics depending on a load variation.

When the number of average data of voltage detection data as well as that of average data of amperage detection data has reached 100, the flow goes from the step S511 to a subsequent step S513, where a file of the second function 27 is driven for reading from the memory 35 the total of 100 average voltage data and the total of 100 average amperage data to estimate an approximate linear function I =aV+b by applying a method of least squares to the read data, such that least squares are achieved of a sum of squares of associated errors.

As illustrated in FIG. 3, such the approximate linear function describes a straight line I=aV+b that is best representative of a feature of the set of dispersed data including combinations of voltage and amperage data defined on the voltage axis and the amperage axis, respectively.

Referring now to FIG. 2, the afore-mentioned method of least squares will be further described. The file of the second function 27 has the set {(D9, D11)} of a total of 100 combinations of data $(D9_{n1}, D11_{n1})$, $(D9_{n2}, D11_{n2})$, ... $(D9_{nq}, D11_{nq})$, ..., $(D9_{n100}, D11_{n100})$ read from the memory 35, which data combinations may be approximated in a variety of manners. In the embodiment, they should be well approximated by a linear expression such that:

$$Y=F(X)=aX+b,$$

as they are averaged data on the simulation of a constant travelling. Letting G be an error function of four variables X, Y, a and b, such that:

$$G(X,Y,a,b)=Y-F(X)=Y-(aX+b),$$

a best approximation will minimize an absolute value of the function G. Letting lGil be the absolute value of G(X,Y,a,b), as its X and Y are substituted by data $D9_{ni}$ and $D11_{ni}$ of an i-th data combination $(D9_{ni}, D11_{ni})$, such that:

$$|G_i|=|G_i (D9_{ni},D11_{ni},a,b)|=|D9_{ni}-(aD11_{ni}+b)|,$$

it so follows that the best approximation should minimize a sum $\Sigma$ of squares $(|G_i|^2=G_i^2)$ of $|G_i|$, where the sum $\Sigma$ is taken over all occurrences of suffix i that ranges from 1 to N (=100, unless some data is omitted or missing).

Letting in this paragraph $I_i$ be $D9_{ni}$, $V_i$ be $D11_{ni}$ and S be the sum $\Sigma|G_i|^2$, we have an expression, such that:

$$S=\Sigma\{I_i-(aV_i+b)\}^2,$$

partially differentiating both sides of this expression by a and b, letting the results be each respectively a null as a condition of extreme value, such that:

$$\partial S/\partial a=\Sigma[2\{I_i-(aV_i+b)\}(-V_i)]=0 \text{ and}$$

$$\partial S/\partial b=\Sigma[2\{I_i-(aV_i+b)\}(-1)]=0,$$

collecting factors in terms of a and b, such that:

$$\{\Sigma(2V_i^2)\}a+\{\Sigma(2V_i)\}b-\{\Sigma(2I_iV_i)\}=0 \text{ and}$$

$$\{\Sigma(2V_i)\}a+(2N)b-\{\Sigma(2I_i)\}=0,$$

solving this pair of concurrent equations for a and b, we have:

$$\begin{aligned}
a &= [2N\Sigma(2I_iV_i) - \Sigma(2V_i)\Sigma(2I_i)]/[2N\Sigma(2V_i^2) - \{\Sigma(2V_i)\}^2] \\
&= \{\Sigma I_iV_i - (\Sigma V_i\Sigma I_i)/N\}/\{\Sigma V_i^2 - (\Sigma V_i)^2/N\} \text{ and} \\
b &= [(\Sigma 2V_i^2)\Sigma 2I_i - \Sigma 2V_i(\Sigma 2I_iV_i)]/[2N\Sigma 2V_i^2 - (\Sigma 2V_i)^2] \\
&= \{(\Sigma V_i^2\Sigma I_i)/N - (\Sigma V_i\Sigma I_iV_i)/N\}/\{\Sigma V_i^2 - (\Sigma V_i)^2/N\} \text{ or} \\
b &= [\{\Sigma(2I_i)\} - \{\Sigma(2V_i)\}a]/2N \\
&= (\Sigma I_i)/N - (\Sigma V_i)a/N \\
&= \Sigma(I_i/N) - \Sigma\{V_i(a/N)\}.
\end{aligned}$$

It will be seen that V=(I-b)/a for an arbitrary I.

Figure 6:
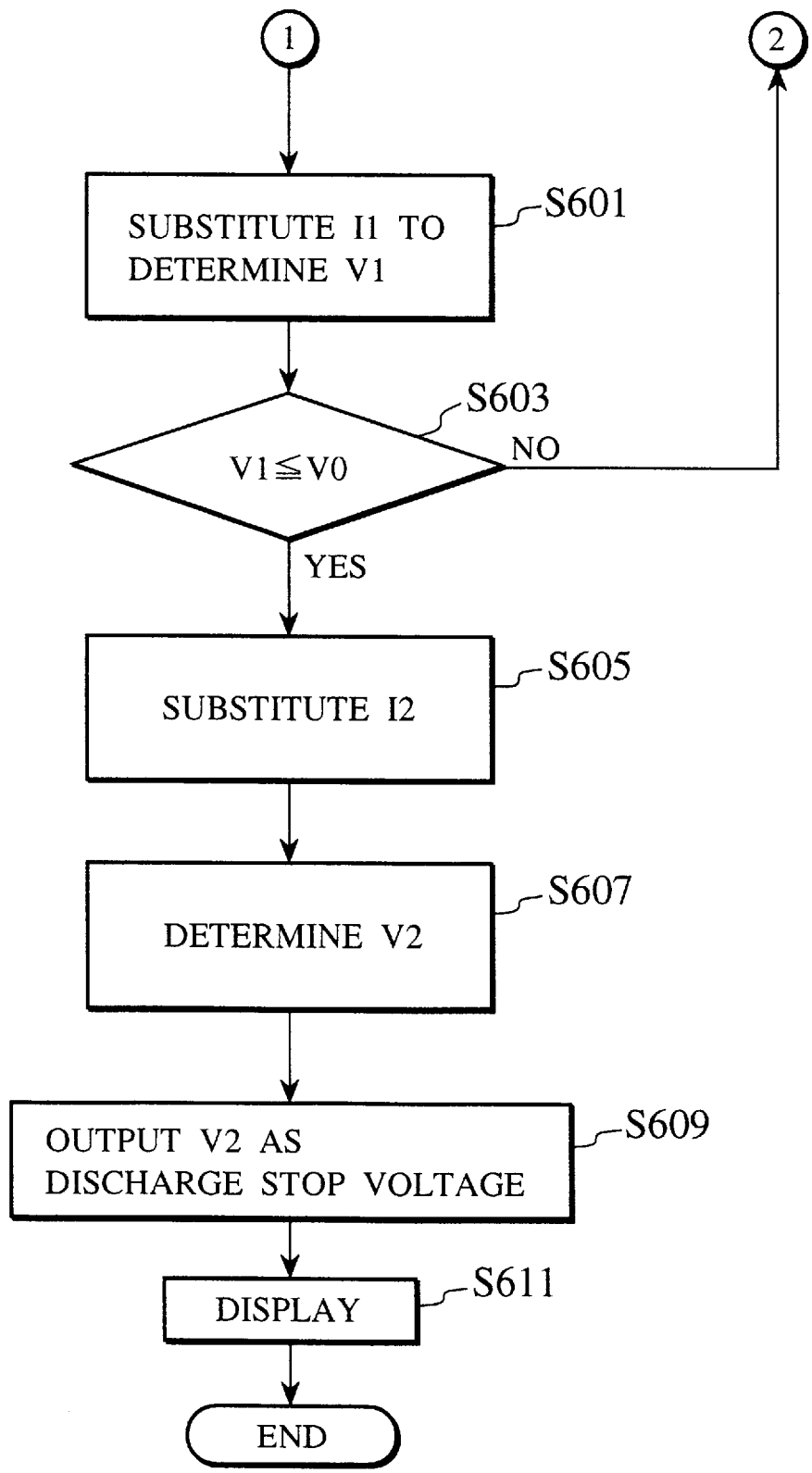
Figure 7:
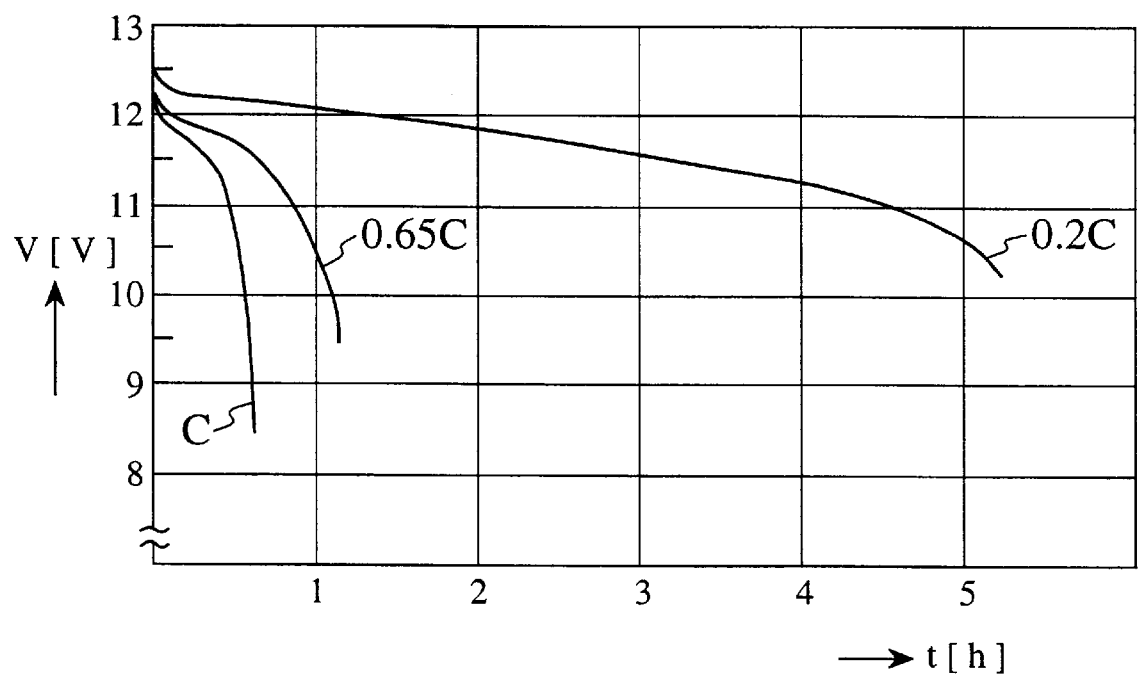
FIG. 7 is a graph describing a V-t characteristic of the cell, for various discharge currents.

Referring now to FIG. 6, the program flow has now come to a step S601 for substituting a first reference value I1 (=10 [A] in this embodiment) to the approximate linear function $F_n$ to estimate a first voltage V1. Then, at a decision step S603, it is checked if the first voltage V1 has come down to a reference discharge stop voltage V0.

Unless the first voltage V1 has reached the reference voltage V0, the flow goes from the step S603 via a node to the step S501 of FIG. 1 so that new voltage and amperage detection data V0LT and CURR are sampled, a new approximate linear function $F_{n+1}$ is generated therefrom, and the first reference value I1 is substituted thereto to obtain a new first voltage V1, which undergoes a decision at the step S603.

Upon a decision at the step S603 that an m-th first voltage V1 has reached the reference voltage V0, the flow goes via a step S605, where it drives a file of the fourth function 31 for substituting a second reference value I2=-I1 (=-10 [A]) to an approximate linear function $F_m$, to a subsequent step S607, where the file of function 31 estimates a corresponding second voltage V2, and accepts the voltage V2 as an estimated discharge stop voltage. Then, at a step S611, a display data Dd representative of the discharge stop voltage is output to the display 17, where it is displayed.

In other words, the embodiment employs sample data of a terminal voltage and a discharge current of a battery 7 to estimate therefrom an approximate linear function $F_n$ representative of a voltage vs. current characteristic of the battery 7, substitutes a first reference value I1 to the approximate linear function to estimate a first voltage V1, responds to an arrival of the first voltage V1 at a reference discharge stop voltage V0 due such as to a test to substitute a second reference value I2 to a corresponding approximate linear function $F_m$, thereby estimating a second voltage V2, and outputs the second voltage V2 as a required discharge stop voltage for use in an electric vehicle having the battery 7 installed therein.

As shown in FIG. 4, the substitution of a first reference value of 10 [A] to a sequence of functions $(I=a_nV+b_n)$ provides a sequence of first voltages V1 as data representative of a characteristic L1 that has an increased tendency to downwardly curve, as the time approaches close to a discharge stop time te, which however is inconsistent with an intended use of an approximate linear function $F_n$ that assumes a capacity reduction rate of a battery 7 to be substantially constant with time.

Therefore, in consideration of a correlation between a charge and a discharge, the system S is adapted such that, when a latest (m-th) one of the first voltages has reached (or downwardly exceeded) a reference discharge stop voltage V0, a corresponding approximate linear function $F_m$ has a second reference value of a -10 [A] substituted therein to provide a second voltage V2 as an estimated discharge stop voltage to be found on a characteristic line L2 that remains linear even in a vicinity of the discharge stop time te.

Accordingly, it does not need an actual travelling of an actual electric car for the system S, which includes a simulating load section Sa, to estimate an apparent discharge stop voltage in a facilitated manner even in a development stage.

It will be seen that the first reference value I1 may be different from the 10 [A] and that the second reference value I2 may also be different from the −10 [A].

In this respect, letting $V1_m$ be an m-th first voltage, it so follows that $I1=a_m V1_m + b_m$ and $I2=a_m V2 + b_m$. Assuming $I2=-I1$ and $V1_m=V0$, one can have an equivalent expression, such that $I1=a_m(V0-V2)/2$ or $V2=V0-2I1/a_m$, in which V0 is given, $a_m$ is a slant a of a straight line (FIG. 3), the battery 7 can repeat a discharge after a charge, and the simulation can be repeated to achieve an identical result (i.e. V2). It may thus be facile for an artisan to provide an adequate reference value I1 and directly estimate therefrom a second voltage V2. Further, these values may be combined with a rotation speed of a motor 1, and a set of such value combinations may be associated with a speed range or may correspond to a set of different speeds.

It will also be seen that the system S may have, in place of the section Sa, a similar load section for simulating an arbitrary article that can constitute an electric load of a battery 7, which may have a non-linear V-t characteristic, and the computer section Sc of the system S may preferably estimate a discharge stop voltage for equipment in which like battery 7 is installed.

While preferred embodiments of the present invention have been described using specific terms, such description is for illustrative purposes, and it is to be understood that changes and variations may be made without departing from the spirit or scope of the following claims.

What is claimed is:

1. A method for estimating a discharge stop terminal voltage level for an electric system having a system cell supplying a predetermined level of current to drive a system load in a defined manner until the system cell terminal voltage level falls below the discharge stop terminal voltage level, comprising the steps of:

providing a simulation cell with characteristics equivalent to characteristics of the system cell;

providing a simulated load having load characteristics equivalent to load characteristics of the system load;

driving the simulated load with a discharge current from the simulation cell to simulate the defined manner of driving the system load;

detecting the discharge current and a terminal voltage of the simulation cell during said driving step and providing samples of the detected discharge current and simulation cell terminal voltage;

collecting a first set of sample data of the discharge current samples occurring in an arbitrary time period and a second set of sample data of the simulation cell terminal voltage samples occurring in the arbitrary time period;

processing a combination of the first set of sample data and the second set of sample data to obtain an approximate linear function representing a relationship between the detected discharge current and the detected terminal voltage of the simulation battery;

calculating a first voltage level by substituting a first reference value for current equal to the predetermined level of current into the linear approximate function;

comparing the first voltage level to a predetermined reference voltage level;

substituting a second predetermined reference current value into the approximate linear function to calculate a second voltage level when the comparing step determines that the first voltage level is equal to or lower than the predetermined reference voltage level; and outputting the second voltage level as the estimated discharge stop voltage level.

2. The method according to claim 1, wherein
   the system load comprises a main electric motor for an electric vehicle.

3. The method according to claim 2, wherein the defined manner being simulated in the driving step is movement of the electric vehicle at a constant rate.

4. The method according to claim 3, wherein the first reference value and the second predetermined reference current value are identical in absolute value but have a different sign.

5. The method according to any of claims 1 to 4, wherein the predetermined reference voltage level comprises a voltage level below which the system cell provides no discharge current or a minimum working voltage level of the system load, whichever is higher.

6. A system for estimating a discharge stop terminal voltage level for an electric system having a system cell supplying a predetermined level of current to drive a system load in a defined manner until the system cell terminal voltage level falls below the discharge stop terminal voltage level, comprising:

a simulation cell having characteristics equivalent to characteristics of the system cell;

a simulated load having load characteristics equivalent to load characteristics of the system load;

means for driving the simulated load with a discharge current from the simulation cell;

means for detecting discharge current and a terminal voltage of the simulation cell during driving;

means for providing detected discharge current samples and detected terminal voltage samples;

means for collecting a first set of sample data of the discharge current samples provided during an arbitrary time period of the driving of the simulated load and a second set of sample data of the terminal voltage samples during the arbitrary time period;

means for processing a combination of the first set of sample data and the second set of sample data to obtain an approximate linear function representing a relationship between the detected discharge current and the detected terminal voltage level;

means for calculating a first voltage level by substituting a first reference value for current equal to the predetermined level of current into the approximate linear function;

means for comparing the first voltage level to a predetermined reference voltage level;

means responsive to the means for comparing for substituting a second predetermined reference current value into the approximately linear function to calculate a second voltage level when the first voltage level is equal to or lower than the predetermined reference voltage level; and means for outputting the second voltage level as the estimated discharge stop terminal voltage level.

7. The system according to claim 6, wherein the system load comprises a main electric motor for an electric vehicle.

8. The system according to claim 7, wherein the defined manner being simulated by the means for driving the simulated load is simulating movement of the electric vehicle at a constant rate.

9. The system according to claim 8, wherein the first reference value and the second predetermined reference current value are identical in absolute value but have a different sign.

10. The system according to any of claims 6 to 9, wherein the predetermined reference voltage level comprises a voltage level below which the system cell provides no discharge current or a minimum working voltage level of the system load, whichever is higher.

11. A method for estimating a discharge stop voltage of a cell, comprising the steps of:

driving a load using a discharge current from the cell;

detecting the discharge current and cell terminal voltage while driving the load and providing samples of detected discharge current and samples of detected cell terminal voltage;

collecting a first set of samples including a predetermined number of discharge current samples and a second set of samples including a predetermined number of cell terminal voltage samples;

processing the first set of samples and the second set of samples for determining an approximate linear function representing a relationship between the detected discharge current and the detected cell terminal voltage;

determining a first voltage value by substituting a first reference current of a positive value into the approximate linear function;

determining whether or not the first voltage value has reached a preset value;

responding to the first voltage value reaching the preset value to substitute a third reference data of a negative value into the approximate linear function to determine a second voltage level; and providing the second voltage level as an estimated value of the discharge stop voltage of the cell in a system including the cell and the load connected thereto.

12. A system for estimating a discharge stop voltage of an object cell for use in an electric system including a load connectable thereto, comprising:

a simulation load having characteristics corresponding to characteristics of the load of the electric system;

the object cell being connected to the simulation load;

detection means for detecting a discharge current provided from the object cell to the simulation load and a terminal voltage of the object cell;

means for collecting a predetermined number of samples of the terminal voltage and a predetermined number of samples of the discharge current from an output of the detection means;

voltage versus amperage approximate linear function determining means for determining an approximate linear function between the terminal voltage and the discharge current over a period of time;

first discharge stop voltage calculating means responsive to each determination of the approximate linear function for substituting a positive reference current value into the approximate linear function to determine a first voltage level;

means for determining whether or not the first voltage level has reached a preset value; and second discharge stop voltage calculating means responsive to the first voltage level being determined to have reached the preset value for substituting a negative reference current value into the approximate linear function to determine a second voltage level; and means for displaying the second voltage level as an estimated value of the discharge stop voltage for the object cell, when it is installed in the electric system.

13. The system according to claim 12, wherein the means for determining is responsive to the first voltage level not reaching the preset level for causing the means for collecting to again collect the predetermined manner of samples of the terminal voltage and the predetermined number of samples of the discharge current.

14. The system according to claim 12 or 13, wherein the voltage versus amperage approximate linear function determining means is responsive to the predetermined numbers of samples of the terminal voltage and predetermined numbers of samples of the discharge current as they are collected for applying a method of least squares to determine the approximate linear function.

* * * * *